(12) United States Patent  
Lym

(10) Patent No.: US 9,355,723 B1
(45) Date of Patent: May 31, 2016

(54) SEMICONDUCTOR DEVICE INCLUDING A NON-VOLATILE MEMORY PRESERVING DATA STORED IN A VOLATILE MEMORY WHEN POWERED OFF

(71) Applicant: SK hynix Inc., Icheon-si Gyeonggi-do (KR)

(72) Inventor: Sangkug Lym, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/732,037

(22) Filed: Jun. 5, 2015

(30) Foreign Application Priority Data

Jan. 27, 2015 (KR) ........................ 10-2015-0012532

(51) Int. Cl.
*G11C 11/00* (2006.01)
*G11C 14/00* (2006.01)

(52) U.S. Cl.
CPC ...................... *G11C 14/00* (2013.01)

(58) Field of Classification Search
USPC ............. 365/185.04, 185.05, 185.08, 185.09, 365/185.11, 185.2, 185.33, 226, 228
See application file for complete search history.

(56) References Cited

U.S. PATENT DOCUMENTS

| 8,675,406 B2* | 3/2014 | Lee | G11C 16/0483 |
| | | | 365/185.11 |
| 8,953,390 B2* | 2/2015 | Ogawa | G11C 7/18 |
| | | | 365/185.11 |

FOREIGN PATENT DOCUMENTS

KR  1020140049210 A  4/2014

* cited by examiner

*Primary Examiner* — Trong Phan
(74) *Attorney, Agent, or Firm* — William Park & Associates Ltd.

(57) ABSTRACT

A semiconductor device may include a controller configured to generate a data retention path control signal in response to a power condition change signal. The semiconductor device may include a plurality of data retention paths configured to sequentially couple a plurality of global input/output (I/O) lines coupled to a volatile memory to a dummy I/O line in response to the data retention path control signal. The semiconductor device may include a dummy I/O pad coupled to the dummy I/O line. The semiconductor device may include a non-volatile memory device coupled to the dummy I/O pad, configured to retain a plurality of storage data received from the volatile memory when the volatile memory is powered off, or provide data retained in the volatile memory as recovery data when power is recovered by the volatile memory.

20 Claims, 7 Drawing Sheets

SEMICONDUCTOR DEVICE INCLUDING A NON-VOLATILE MEMORY PRESERVING DATA STORED IN A VOLATILE MEMORY WHEN POWERED OFF

CROSS-REFERENCE TO RELATED APPLICATION

This application claims priority based upon Korean patent application No. 10-2015-0012532, filed on Jan. 27, 2015, the disclosure of which is hereby incorporated in its entirety by reference herein.

BACKGROUND

1. Technical Field

Embodiments of the present disclosure generally relate to a semiconductor device, and more particularly to a semiconductor device including a non-volatile memory configured to preserve data stored in a volatile memory when powered off.

2. Related Art

Volatile memory devices have a high operation speed and a high integration degree. The volatile memory devices can be widely used in many technical fields because of the high operation speeds and high degrees of integration. However, a power-supply voltage should be persistently applied to a volatile memory device to retain data stored in the volatile memory device. If the volatile memory device is abruptly powered off without prior notice, data stored in the volatile memory device is unavoidably lost.

A non-volatile memory device serving as a kind of backup memory contained in a single semiconductor device, has advantages in that it has a high operation speed and high integration degree, this resulting in reduction of power loss and data loss.

SUMMARY

According to an embodiment, there may be provided a semiconductor device. The semiconductor device may include a controller configured to generate a data retention path control signal in response to a power condition change signal. The semiconductor device may include a plurality of data retention paths configured to sequentially couple a plurality of global input/output (I/O) lines coupled to a volatile memory to a dummy I/O line in response to the data retention path control signal. The semiconductor device may include a dummy I/O pad coupled to the dummy I/O line. The semiconductor device may include a non-volatile memory device coupled to the dummy I/O pad, configured to retain a plurality of storage data received from the volatile memory when the volatile memory is powered off, or provide data retained in the volatile memory as recovery data when power is recovered.

According to an embodiment, there may be provided a semiconductor device. The semiconductor device may include a volatile memory device, when powered off, configured to serialize a plurality of storage data received from a plurality of global input/output (I/O) lines coupled to a volatile memory in response to a power condition change signal, and provide the serialized storage data through a dummy I/O pad. The semiconductor device may include a non-volatile memory device configured to retain the serialized storage data provided through the dummy I/O pad.

According to an embodiment, there may be provided a semiconductor device. The semiconductor device may include a controller configured to generate a data retention path control signal in response to a power condition change signal. The semiconductor device may include a plurality of data retention paths configured to sequentially couple a plurality of global input/output (I/O) lines coupled to a volatile memory to a dummy I/O line in response to the data retention path control signal. The semiconductor device may include a dummy I/O pad coupled to the dummy I/O line. The semiconductor device may include a non-volatile memory device coupled to the dummy I/O pad, configured to retain a plurality of storage data received from the volatile memory when a change in a power condition occurs with the volatile memory, or provide data retained in the volatile memory as recovery data when a power condition occurs with the volatile memory.

DETAILED DESCRIPTION

Reference will now be made to the embodiments of the present disclosure, examples of the various embodiments are illustrated in the accompanying drawings. Wherever possible, the same reference numbers will be used throughout the drawings to refer to the same or like parts.

In association with the embodiments, specific structural and functional descriptions are disclosed only for illustrative purposes, the embodiments can be implemented in various ways without departing from the scope or spirit of the present disclosure.

Various embodiments of the present disclosure may be directed to providing a semiconductor device that substantially obviates one or more problems due to limitations and disadvantages of the related art.

An embodiment of the present disclosure may relate to a technology for obtaining a data transmission path through which data is transmitted to a non-volatile memory device using dummy input/output (I/O) constituent elements contained in a volatile memory device.

An embodiment of the present disclosure may relate to a technology for performing serialization of a data transmission path through which data is transferred from a volatile memory to a non-volatile memory device when powered off, resulting in minimization of a data signal shield structure.

Figure 1:
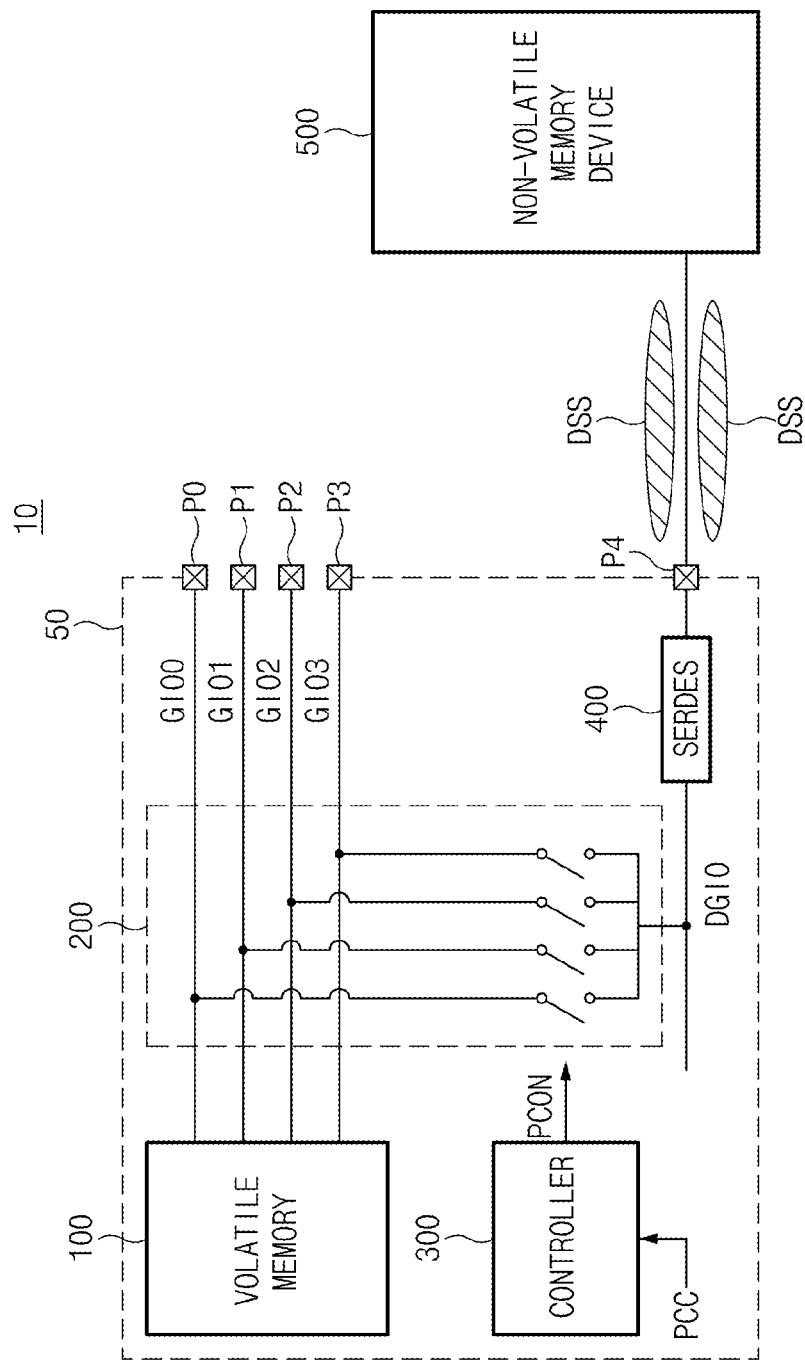
FIG. 1 is a schematic diagram illustrating a representation of an example of a semiconductor device according to an embodiment.

FIG. 1 is a schematic diagram illustrating a representation of an example of a semiconductor device according to an embodiment.

Referring to FIG. 1, a semiconductor device 10 may include a volatile memory storing data therein, a controller 300, a plurality of data retention paths 200, and a non-volatile memory device 500. The volatile memory 100, the controller 300, and the data retention paths 200 may be contained in a volatile memory device 50.

The semiconductor device 10 may provide storage data stored in the volatile memory 100 to the non-volatile memory device 500 in response to a power condition change signal (PCC) to the non-volatile memory device 500. The semiconductor device 10 may store again recovery data stored and retained in the non-volatile memory device 500. For example, the power condition change signal (PCC) may be generated when powered off or when power is recovered by the semiconductor device 10.

Plural data segments being read and output from individual global input/output (I/O) lines (GIO0, GIO1, GIO2, GIO3) will hereinafter be respectively referred to as 'storage data segment' for convenience of description. Therefore, plural storage data segments may be applied to the non-volatile memory device 500 through a plurality of global I/O lines (GIO0, GIO1, GIO2, GIO3). For example, data, which is stored in the non-volatile memory device 500 and then provided to the volatile memory device 50, will hereinafter be referred to as 'recovery data' for convenience of description. Accordingly, one recovery data may be divided into a plurality of global I/O lines (GIO0, GIO1, GIO2, GIO3) and then stored again in the volatile memory 100.

The controller 300 may generate a data retention path control signal (PCON) in response to a power condition change signal (PCC). A plurality of data retention paths 200 coupled to a plurality of global I/O lines (GIO0, GIO1, GIO2, GIO3) may be coupled to one dummy I/O line (DGIO), resulting in formation of a data retention path control signal (PCON) through which plural storage data segments can be sequentially provided to the dummy I/O line (DGIO) when powered off. When power is recovered, a data retention path control signal (PCON) through which one recovery data is divided into a plurality of global I/O lines (GIO0, GIO1, GIO2, GIO3) may be generated.

The plurality of data retention paths 200 may be sequentially coupled not only to a plurality of global I/O lines (GIO0, GIO1, GIO2, GIO3) coupled to the volatile memory 100 but also to the dummy I/O line (DGIO), upon receiving the data retention path control signal (PCON).

The data retention paths 200 may have the same or different structures as in a first example in which several storage data segments received from the volatile memory 100 are supplied to the non-volatile memory device 500 and as in a second example in which recovery data stored in the non-volatile memory device 500 is re-supplied to the volatile memory 100. The data retention paths 200 will hereinafter be described with reference to FIGS. 2 to 5.

Although the dummy I/O line (DGIO) has already been implemented or contained in the volatile memory device 50, the dummy I/O line (DGIO) may correspond to redundant global I/O lines unused in the data I/O operation. For example, the volatile memory device 50 according to an embodiment may input/output with four global I/O lines (GIO0, GIO1, GIO2, GIO3) during a normal operation. That is, the four global I/O lines (GIO0, GIO1, GIO2, GIO3) may receive/transmit data from or to an external part through the first to fourth I/O pads (P0, P1, P2, P3), respectively.

However, the volatile memory device 50 having another volatile memory may receive or transmit data from or to the external part through 8 global I/O lines. For this purpose, eight global I/O lines and eight I/O pads may be contained in the volatile memory device 50. Accordingly, I/O constituent elements unused in the normal operation may be contained in the volatile memory device 50.

The dummy I/O line (DGIO) and the dummy I/O pad (P4) may be contained in the volatile memory device 50 to implement the I/O operation of several data segments. Since the semiconductor device 10 may employ the existing dummy constituent elements unused in the normal operation when a power condition is changed, the semiconductor device 10 remains unchanged in size and operation efficiency can be improved.

In accordance with an embodiment, the volatile memory device 50 may further include a serialization/parallelization unit 400. The serialization/parallelization unit 400 may be coupled to the dummy I/O line (DGIO). The serialization/parallelization unit 400 may re-convert a plurality of serial storage data segments sequentially received from the global I/O lines (GIO0, GIO1, GIO2, GIO3) when powered off into parallel/serial data. The serialization/parallelization unit 400 may provide the parallel/serial data to the non-volatile memory device 500 through the dummy I/O pad P4. For example, the serialization/parallelization unit 400 may transmit the serialized storage data segments, that correspond to storage data, to the non-volatile memory device 500 when the power condition change signal is enabled.

The reason why the serialization/parallelization unit 400 performs the above-mentioned operations may be that a burst operation in which plural data bits can be contained in individual time points is performed at the global I/O lines (GIO0, GIO1, GIO2, GIO3). The burst operation is well known to those skilled in the art, and as such a detailed description thereof will herein be omitted for convenience of description.

In accordance with an embodiment, the serialization/parallelization unit 400 may also perform serialization/parallelization of recovery data so that the recovery data received from the non-volatile memory device 500 during the power recovery can be stored and attained in the volatile memory 100.

Since the plurality of global I/O lines (GIO0, GIO1, GIO2, GIO3) perform the data I/O operation through the burst operation during the normal operation, the serialization/parallelization unit 400 may also be contained in the redundant global I/O lines.

A data signal shield (DSS) may be formed around a signal line through which the dummy I/O pad P4 is connected to the non-volatile memory device 500. The data signal shield (DSS) may protect signals for preventing the occurrence of interference associated with contiguous signal lines.

Assuming that a power condition is changed, if a plurality of storage data segments received through a plurality of global I/O lines (GIO0, GIO1, GIO2, GIO3) are applied to the non-volatile memory device 500 through a plurality of signal lines, the data signal shield (DSS) may be needed for the plurality of signal lines. However, the semiconductor device 10 according to an embodiment may transmit a plurality of storage data segments supplied from the volatile memory device 50 to the non-volatile memory device 500 or recovery data supplied from the non-volatile memory device 500 to the volatile memory device 50 through a single signal line, so that required data signal shield (DSS) can be minimized.

Figure 2:
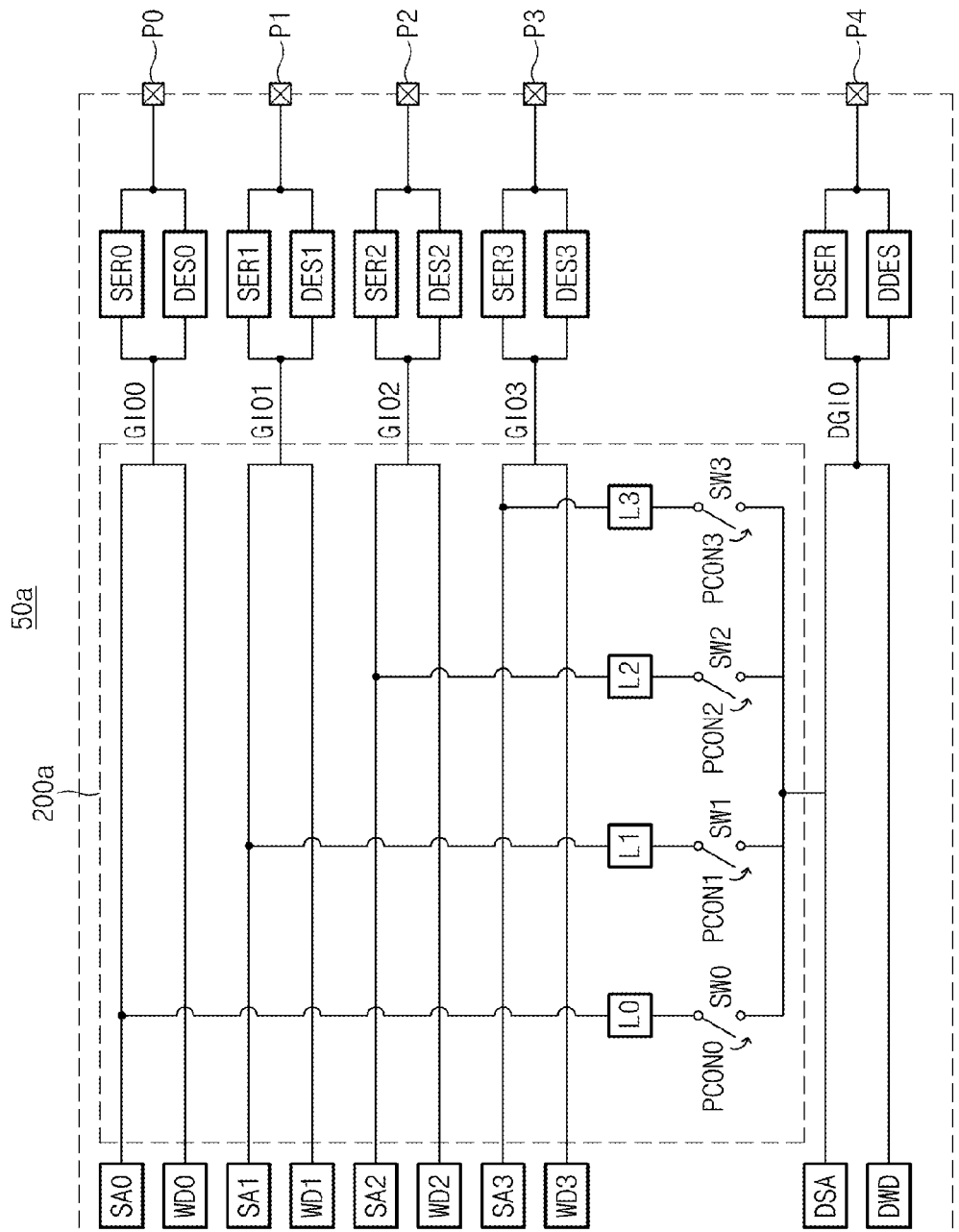
FIG. 2 is a circuit diagram illustrating a representation of an example of a semiconductor device according to an embodiment.

FIG. 2 is a circuit diagram illustrating a representation of an example of a semiconductor device according to an embodiment. Referring to FIG. 2, FIG. 2 illustrates a representation of an example of a plurality of data retention paths when the semiconductor device is powered off, and illustrates a representation of an example of some parts of the volatile memory device illustrated in FIG. 1.

Referring to FIG. 2, the global I/O lines (GIO0, GIO1, GIO2, GIO3) contained in the volatile memory device 50a may be respectively divided among the sense amplifiers (SA0, SA1, SA2, SA3) and the write drivers (WD0, WD1, WD2, WD3) at a stage connected to the volatile memory 100 (i.e., see FIG. 1). The global I/O lines (GIO0, GIO1, GIO2, GIO3) may be divided to be respectively coupled to the serialization units (SER0, SER1, SER2, SER3) and the parallelization units (DES0, DES1, DES2, DES3) at a stage connected to the I/O pads (P0, P1, P2, P3).

For example, the first global I/O line (GIO0) may receive storage data segment from the volatile memory 100 through the first sense amplifier (SA0), perform serialization of the received storage data segment through a first serialization unit (SER0), and may provide the serialization resultant data to the outside through the first I/O pad (P0). For example, after data received through the first I/O pad (P0) is parallelized through the first parallelization unit (DES0), the parallelization resultant data may be stored in the volatile memory 100 of the volatile memory device 50a through a first write driver (WD0).

The reason why the serialization units (SER0, SER1, SER2, SER3) and the parallelization units (DES0, DES2, DES3, DES4) are allocated to the respective global I/O lines (GIO0, GIO1, GIO2, GIO3) may be that the data I/O operation based on the burst operation is performed through the global I/O lines (GIO0, GIO1, GIO2, GIO3).

A detailed description of the above-mentioned global I/O lines (GIO0, GIO1, GIO2, GIO3) is considered general, and as such a detailed description thereof will herein be omitted for convenience of description.

The data I/O operation may be performed through the global I/O lines (GIO0, GIO1, GIO2, GIO3) during normal operation. If a power-supply state is changed, a plurality of storage data segments received from the respective global I/O lines (GIO0, GIO1, GIO2, GIO3) may be sequentially applied to the dummy I/O line (DGIO) through a plurality of data retention paths 200a in response to a data retention path control signal (PCON) generated from the controller 300 illustrated in FIG. 1.

The plurality of data retention paths 200a may include latches (L0, L1, L2, L3) and switches (SW0, SW1, SW2, SW3). The latches (L0, L1, L2, L3) may temporarily store the storage data segment received from the global I/O lines (GIO0, GIO1, GIO2, GIO3), respectively. The switches (SW0, SW1, SW2, SW3) may couple the latches (L0, L1, L2, L3) to the dummy I/O line (DGIO).

The first data retention path may receive storage data segment from the first sense amplifier (SA0) of the first global I/O line (GIO0), and temporarily store the received storage data segment in the first latch (L0). Since the first switch (SW0) may be turned on in response to a first data retention path control signal (PCON0) received from the controller 300, storage data segment may be applied to the dummy I/O line (DGIO).

For example, storage data segment received from the second global I/O line (GIO1) is temporarily stored in the second latch (L1) through the second data retention path, and the received storage data segment is supplied to the dummy I/O line (DGIO) through the second switch (SW1) in response to a second data retention path control signal (PCON1). For example, the third and fourth data retention paths may also sequentially provide storage data segments to the dummy I/O line (DGIO) because the third and fourth data retention paths are used for such path connection in the same manner as in the first and second data retention paths.

The plurality of data retention paths 200a are sequentially connected to the dummy I/O line (DGIO) in response to the data retention path control signal (PCON), so that plural storage data segments are serialized and then supplied to the dummy I/O line (DGIO).

In a case where the dummy I/O line (DGIO) receives the storage data segments, the plurality of data retention paths 200a may be coupled to the sense amplifiers (SA0, SA1, SA2, SA3) of the plurality of global I/O lines (GIO0, GIO1, GIO2, GIO3), respectively.

Referring to FIG. 1, the dummy I/O line (DGIO) may have the same structure as in the global I/O lines (GIO0, GIO1, GIO2, GIO3). The dummy I/O line (DGIO) may be divided amongst a dummy sense amplifier (DSA) and a dummy write driver (DWD) at one stage, and may be divided into a dummy serialization unit (DSER) and a dummy parallelization unit (DDES) at the other stage, so that the dummy I/O line (DGIO) may be coupled to one dummy I/O pad P4. The dummy serialization unit (DSER) and the dummy parallelization unit (DDES) may correspond to or be included in the serialization/parallelization unit 400 illustrated in FIG. 1.

Figure 3:
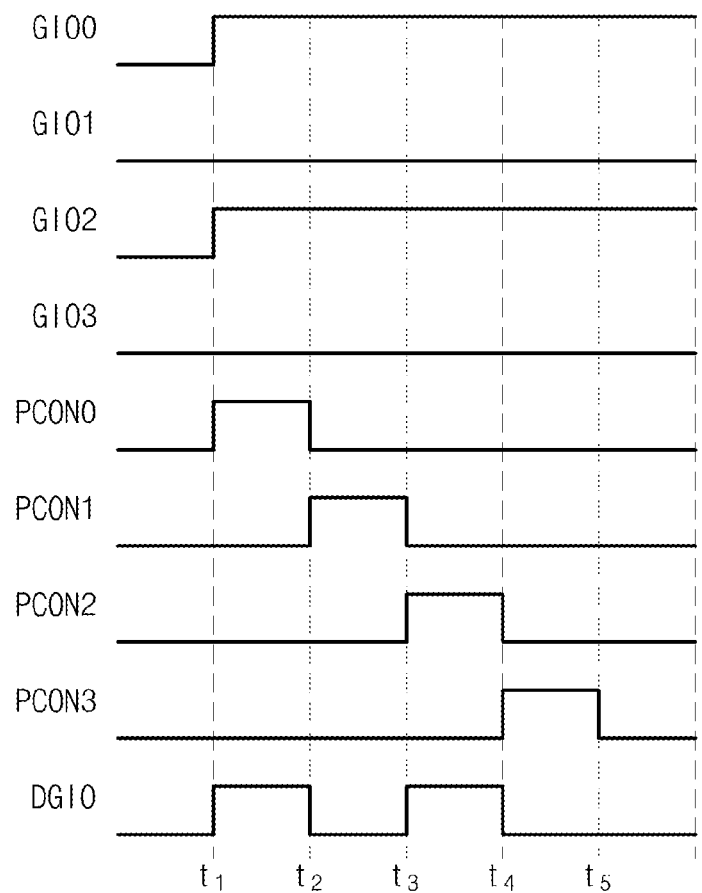
FIG. 3 is a timing diagram illustrating representations of examples of operations of the semiconductor device when powered off as illustrated in FIG. 2.

FIG. 3 is a timing diagram illustrating representations of examples of operations of the semiconductor device when powered off as illustrated in FIG. 2.

Referring to FIG. 3, the plurality of storage data segments is respectively loaded on the first to fourth global I/O lines (GIO0, GIO1, GIO2, GIO3) at a specific time point ($t_1$).

The plurality of data retention paths 200a may store the plurality of storage data segments received from the respective global I/O lines (GIO0, GIO1, GIO2, GIO3) in the first to fourth latches (L0, L1, L2, L3), so that storage data segment of the first global I/O line (GIO0) is loaded on the dummy I/O line (DGIO) in response to the first data retention path control signal (PCON0).

The first data retention path control signal (PCON0) is deactivated at a time point ($t_2$) so that the first switch (SW0) is turned off. The second data retention path control signal (PCON1) is activated so that the second switch (SW1) is turned on. Accordingly, storage data segment, which is supplied to the second global I/O line (GIO1) and stored in the second latch L1, is applied to the dummy I/O line (DGIO).

At a time point ($t_3$), a third data retention path control signal (PCON2) is activated, so that storage data segment stored in the third latch L2 after being received from the third global I/O line (GIO2) is applied to the dummy I/O line (DGIO). At a time point ($t_4$), a fourth data retention path control signal (PCON3) is activated, so that storage data segment stored in the fourth latch L3 after being received from the fourth global I/O line (GIO3) is applied to the dummy I/O line (DGIO).

At a time point ($t_5$), the plurality of storage data segments received from the plurality of global I/O lines (GIO0, GIO1, GIO2, GIO3) may be loaded on the dummy I/O line (DGIO), so that a plurality of serialized storage data segments may be stored in the non-volatile memory device 500 through the dummy I/O pad (P4).

Figure 4:
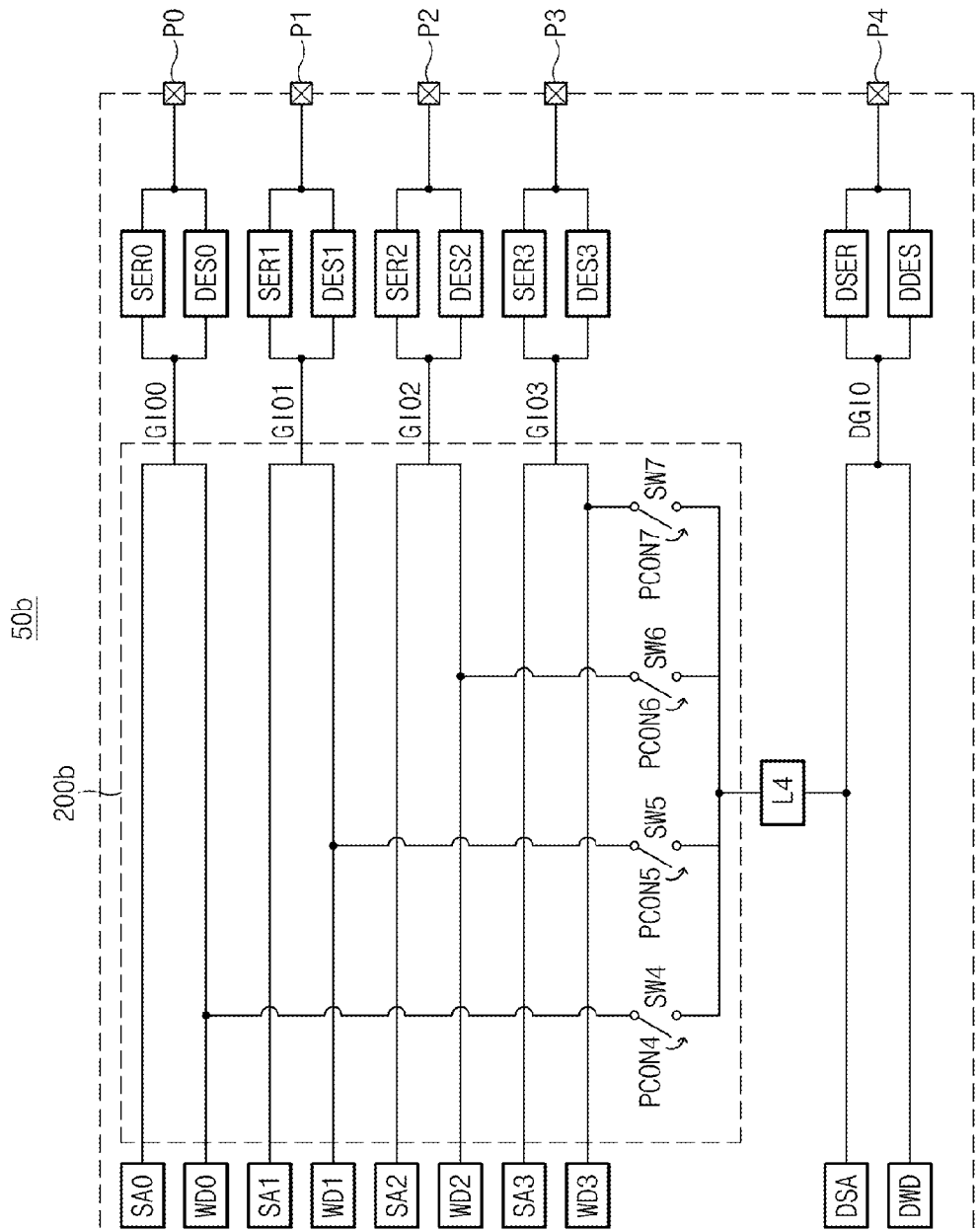
FIG. 4 is a circuit diagram illustrating a representation of an example of a semiconductor device according to an embodiment.

FIG. 4 is a circuit diagram illustrating a representation of an example of a semiconductor device according to an embodiment. Referring to FIG. 4, FIG. 4 illustrates a representation of an example of a plurality of data retention paths when power is recovered, and illustrates a representation of an example of some parts of the volatile memory device illustrated in FIG. 2.

In FIG. 4, a configuration of the dummy I/O line (DGIO) is substantially identical to those of the global I/O lines (GIO0, GIO1, GIO2, GIO3). Like numerals refer to like elements throughout the description of the figures, and as such a detailed description thereof will herein be omitted for convenience of description.

Differently from the volatile memory device 50a illustrated in FIG. 2, the volatile memory device 50b illustrated in FIG. 4 includes a plurality of data retention paths 200b. However, the data retention paths 200a illustrated in FIG. 2 and the data retention paths 200b illustrated in FIG. 4 may be implemented as one structure in the same manner as in the data retention paths 200 illustrated in FIG. 1, and may be physically separated from each other as necessary.

Referring to FIG. 4, the plurality of data retention paths 200b may receive recovery data from the non-volatile memory device 500 through the dummy I/O pad P4. In accordance with an embodiment, the recovery data may be stored in a fifth latch L4.

The recovery data stored in the fifth latch L4 may be stored again in the volatile memory 100 because the plurality of data retention paths 200b are sequentially coupled to the global I/O lines (GIO0, GIO1, GIO2, GIO3) in response to the data retention path control signal (PCON).

The data retention paths 200b may respectively include the switches (SW4, SW5, SW6, SW7) configured to couple the fifth latch L4 to the global I/O lines (GIO0, GIO1, GIO2, GIO3) in response to the data retention path control signal (PCON).

For example, a fifth data retention path may provide some parts of recovery data stored in the fifth latch L4 to the first global I/O line (GIO0) because the fifth switch SW4 is turned on in response to the fifth data retention path control signal (PCON4). A sixth data retention path may provide the other parts of recovery data stored in the fifth latch L4 to the second global I/O line (GIO1) because the sixth switch SW5 is turned on in response to the sixth data retention path control signal (PCON5).

For example, a seventh switch SW6 is turned on in response to the seventh data retention path control signal (PCON6) at a seventh data retention path, another part of recovery data still didn't transmitted to the first or she second global I/O lines (GIO0, GIO1) can be converted into parallel data and then supplied to a third global I/O line (GIO2). An eighth switch SW7 is turned on in response to the eighth data retention path control signal (PCON7) at an eighth data retention path, still remained recovery data can be converted into parallel data and then supplied to a fourth global I/O line (GIO3). The data retention paths 200b may be respectively coupled to the write drivers of the global I/O lines (GIO0, GIO1, GIO2, GIO3).

Figure 5:
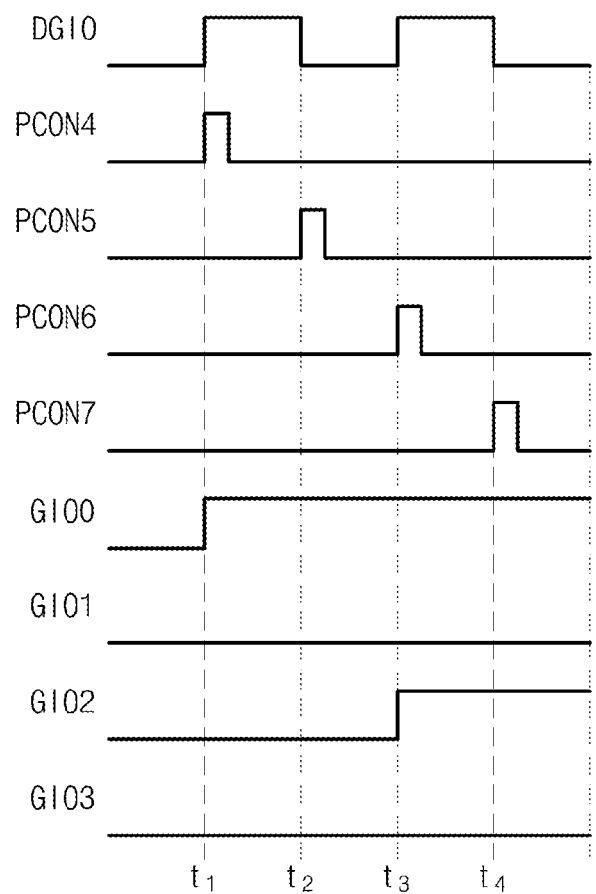
FIG. 5 is a timing diagram illustrating representations of examples of operations of a semiconductor device when power is recovered as illustrated in FIG. 4.

FIG. 5 is a timing diagram illustrating representations of examples of operations of a semiconductor device when power is recovered as illustrated in FIG. 4.

Referring to FIG. 5, recovery data may be loaded on the dummy I/O line (DGIO) through the dummy I/O pad P4. The recovery data may be loaded on the dummy I/O line (DGIO) during a predetermined time ($t_1 \sim t_4$).

The recovery data supplied to the dummy I/O line (DGIO) is temporarily stored in the fifth latch L4, and is then supplied to the first write driver (WD0) of the first global I/O line (GIO0) (specifically, the first global I/O line) because the fifth data retention path control signal (PCON4) is activated at a time point ($t_1$) and the fifth switch SW4 is turned on. Thereafter, data is stored again in the volatile memory 100 through the first write driver WD0 (i.e., see FIG. 1).

A sixth data retention path control signal (PCON5) is activated at a time point ($t_2$), so that recovery data of the dummy I/O line (DGIO) is supplied to the second global I/O line (GIO1) at the time point ($t_2$).

For example, the seventh data retention path control signal (PCON6) is activated at a time point ($t_3$), and recovery data is converted into parallel data and then supplied to the third global I/O line (GIO2) at the time point ($t_3$). The $8^{th}$ data retention control signal (PCON7) is activated at a time point ($t_4$), and recovery data is converted into parallel data and then supplied to the fourth global I/O line (GIO3) at the time point ($t_4$).

Referring to FIGS. 1 and 5, the controller 300 may generate the data retention path control signal (PCON) through which recovery data can be equally divided and the divided recovery data segments are respectively supplied to the global I/O lines (GIO0, GIO1, GIO2, GIO3). For example, the recovery data is equally divided and then supplied to the plurality of data retention paths 200b, so that the controller 300 can generate the data retention path control signal (PCON).

Figure 6:
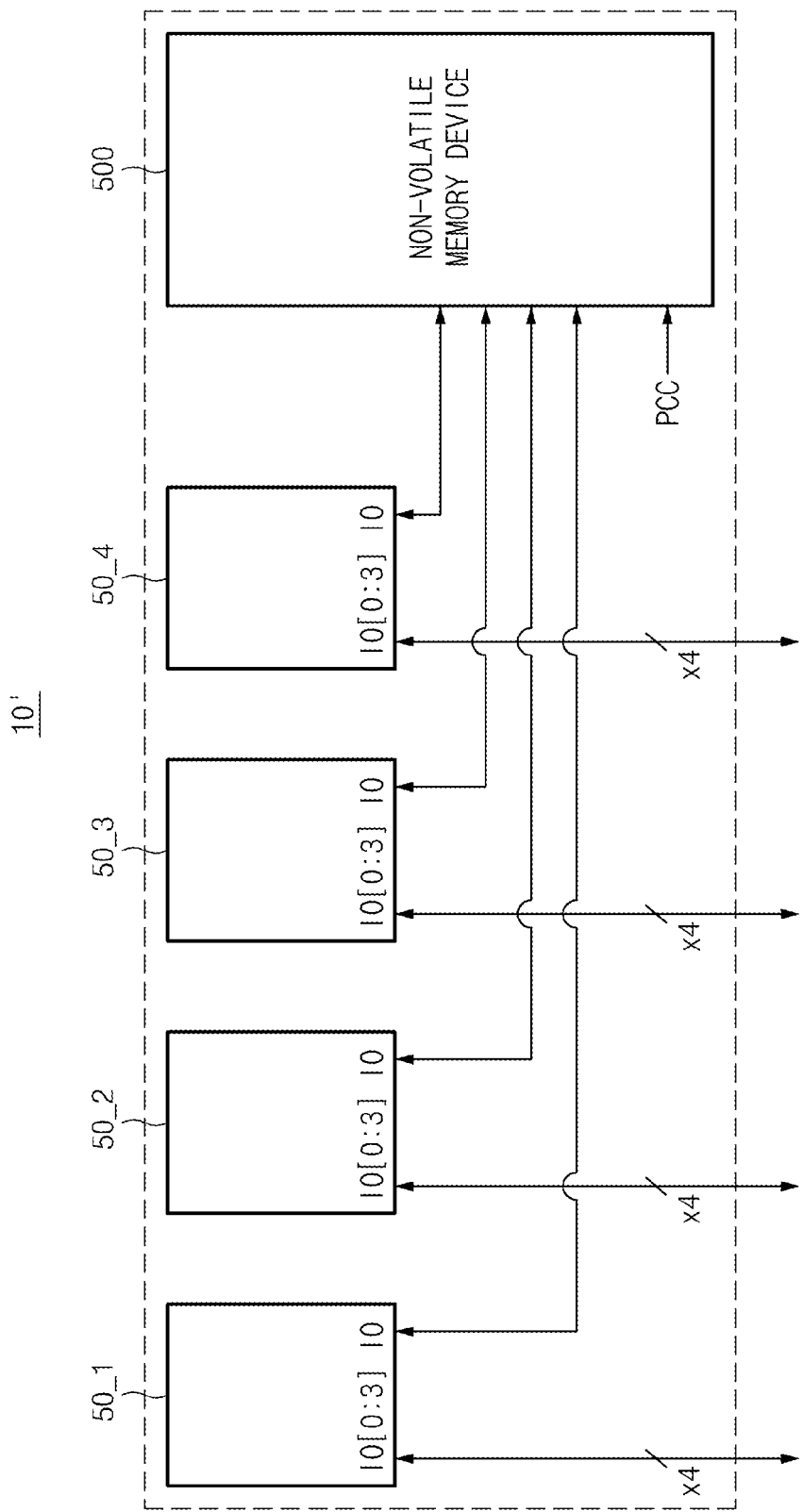
FIG. 6 is a block diagram illustrating a representation of an example of a semiconductor device according to an embodiment.

FIG. 6 is a block diagram illustrating a representation of an example of a semiconductor device according to an embodiment.

Referring to FIG. 6, a semiconductor device 10' may include a plurality of volatile memory devices (50_1, 50_2, 50_3, 50_4) and a non-volatile memory device 500.

The plurality of volatile memory devices (50_1, 50_2, 50_3, 50_4) may have the same structure as that of at least one of the volatile memory devices (50, 50a, 50b) illustrated in FIGS. 1 to 5.

The semiconductor device 10' may include a plurality of volatile memory devices (50_1, 50_2, 50_3, 50_4), so that the semiconductor device 10' may receive/transmit data from or to the outside through the data I/O pad during normal operation. Although each of the volatile memory devices (50_1, 50_2, 50_3, 50_4) is configured to perform the 4-bit I/O operation (IO[0:3]) during the normal operation, the scope and spirit of the present disclosure is not limited thereto. For example, the number of volatile memory devices may be greater or less and the number of bits may be greater or less than four.

Upon receiving the power condition change signal (PCC) during the normal operation, a plurality of storage data segments may be serialized through a plurality of data retention paths (i.e., 200, 200a, 200b) coupled to a plurality of global I/O lines of the plurality of volatile memory devices (50_1, 50_2, 50_3, 50_4), so that the serialized storage data segments (i.e., storage data) is supplied to the non-volatile memory device 500 through a single dummy I/O pad (I0).

In addition, even when the power condition change signal (PCC) is generated after completion of power recovery, recovery data received from the non-volatile memory device 500 is supplied to the plurality of memory devices (50_1, 50_2, 50_3, 50_4) and then parallelized, so that the parallelized recovery data is stored again in the volatile memory 100.

For example, storage data and recovery data are communicated between the non-volatile memory device 500 and the volatile memory devices (50_1, 50_2, 50_3, 50_4) through a single signal line, so that a data signal shield (DSS) for a signal line disposed between the non-volatile memory device 500 and the volatile memory devices (50_1, 50_2, 50_3, 50_4) can be minimized and the amount of power consumption needed for data transmission when powered off can be minimized.

The semiconductor devices (10, 10') according to the embodiments may employ a configuration of the redundant dummy I/O line (DGIO) contained in each of the volatile memory devices (50, 50a, 50b), so that an increase in size can be minimized.

As is apparent from the above description, the semiconductor devices according to the embodiments employs redundant dummy I/O lines contained in a volatile memory when data is applied to a non-volatile memory device when powered off, so that the semiconductor device can improve data retention capabilities without increasing the size thereof when powered off.

Figure 7:
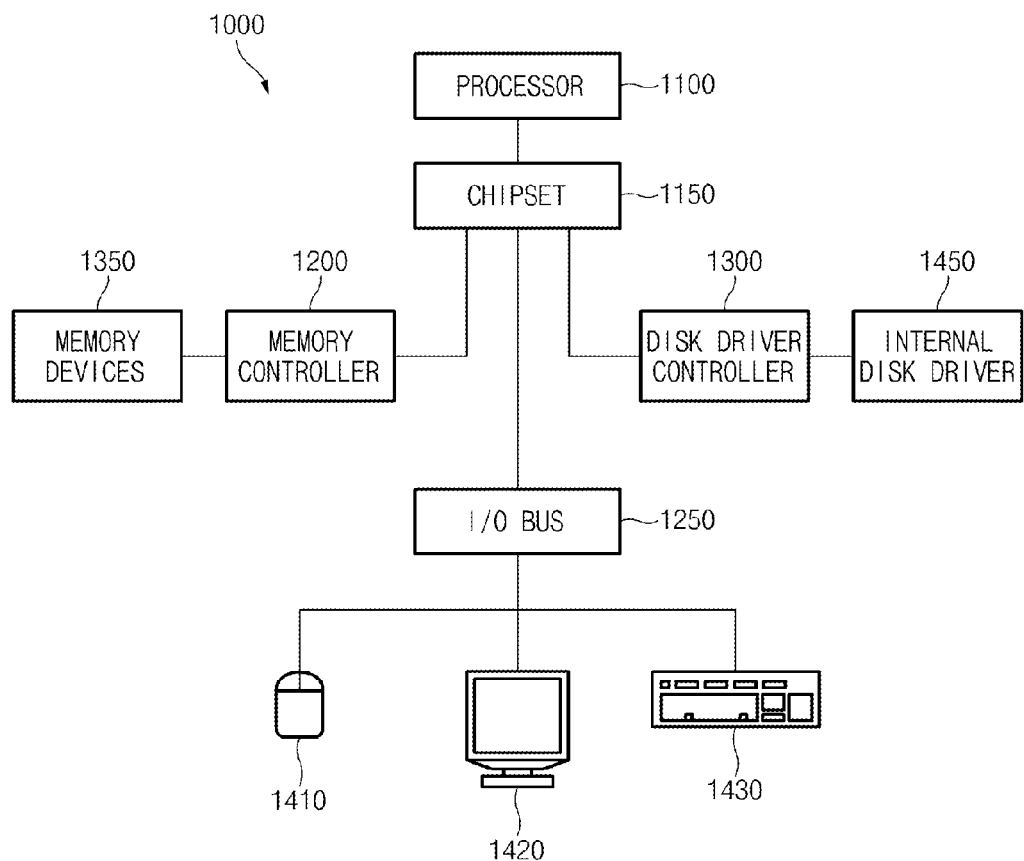
FIG. 7 illustrates a block diagram of an example of a representation of a system employing semiconductor device in accordance with the various embodiments discussed above with relation to FIGS. 1-6.

The semiconductor devices discussed above (see FIGS. 1-6) are particular useful in the design of memory devices, processors, and computer systems. For example, referring to FIG. 7, a block diagram of a system employing a semiconductor device (10, 10') in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device (10, 10') as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device (10, 10') as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing a semiconductor device (10, 10') as discussed above with relation to FIGS. 1-6. In alternate embodiments, such as cellular phones or digital cameras, the components may differ from the embodiments illustrated in FIG. 7.

Those skilled in the art will appreciate that the present disclosure may be carried out in other specific ways than those set forth herein without departing from the spirit and essential characteristics of the present disclosure. The above examples of embodiments are therefore to be construed in all aspects as illustrative and not restrictive. Also, it is obvious to those skilled in the art that claims that are not explicitly cited in each other in the appended claims may be presented in combination as an example of an embodiment of the present disclosure or included as a new claim by a subsequent amendment after the application is filed.

Although a number of illustrative embodiments consistent with the application have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
 a controller configured to generate a data retention path control signal in response to a power condition change signal;
 a plurality of data retention paths configured to sequentially couple a plurality of global input/output (I/O) lines coupled to a volatile memory to a dummy I/O line in response to the data retention path control signal;
 a dummy I/O pad coupled to the dummy I/O line; and
 a non-volatile memory device coupled to the dummy I/O pad, configured to retain a plurality of storage data segments received from the volatile memory when powered off, or provide data retained in the non-volatile memory to the volatile memory as recovery data when power is recovered.

2. The semiconductor device according to claim 1, wherein each of the data retention paths includes:
 a latch configured to temporarily store storage data segment received from one of the plurality of global I/O lines from among the plurality of storage data segments; and
 a switch configured to couple the latch to the dummy I/O line in response to the data retention path control signal.

3. The semiconductor device according to claim 2, wherein the plurality of data retention paths are respectively coupled to sense amplifiers connected to the plurality of global I/O lines.

4. The semiconductor device according to claim 2, wherein the controller, after the storage data received from the plurality of global I/O lines is stored in each latch, is configured to generate a data retention path control signal for activating each switch.

5. The semiconductor device according to claim 1, further comprising:
a latch configured to temporarily store the recovery data received from the non-volatile memory device when power is recovered.

6. The semiconductor device according to claim 5, wherein each of the plurality of data retention paths includes:
a switch configured to couple the latch to the global I/O line in response to the data retention path control signal.

7. The semiconductor device according to claim 6, wherein the plurality of data retention paths are respectively coupled to write drivers connected to the plurality of global I/O lines.

8. The semiconductor device according to claim 6, wherein the controller generates the data retention path control signal in a manner that the recovery data received from the latch is equally divided and supplied to the plurality of data retention paths.

9. The semiconductor device according to claim 1, further comprising:
a plurality of input/output (I/O) pads coupled to the plurality of global I/O lines, respectively, and configured to receive and transmit data from and to the volatile memory during a normal operation.

10. The semiconductor device according to claim 1, further comprising:
a serialization unit configured to perform serialization of data between the dummy I/O line and the dummy I/O pad, and
a parallelization unit configured to perform parallelization of data between the dummy I/O line and the dummy I/O pad.

11. A semiconductor device comprising:
a volatile memory device, when powered off, configured to serialize a plurality of storage data segments as a storage data received from a plurality of global input/output (I/O) lines coupled to a volatile memory in response to a power condition change signal, and provide the storage data through a dummy I/O pad; and
a non-volatile memory device configured to retain the storage data provided through the dummy I/O pad.

12. The semiconductor device according to claim 11, wherein the volatile memory device includes:
a controller configured to generate a data retention path control signal in response to the power condition change signal;
a plurality of data retention paths configured to sequentially couple a plurality of global input/output (I/O) lines coupled to the volatile memory to a dummy I/O line in response to the data retention path control signal, and thus serialize the plurality of storage data segments as the storage data; and
the dummy I/O pad coupled to the dummy I/O line, configured to provide the storage data to the non-volatile memory device.

13. The semiconductor device according to claim 12, wherein each of the plurality of data retention paths includes:
a latch configured to temporarily store the storage data segment; and
a switch configured to couple the latch to the dummy I/O line in response to the data retention path control signal.

14. The semiconductor device according to claim 12, wherein the plurality of data retention paths are respectively coupled to sense amplifiers connected to the plurality of global I/O lines.

15. The semiconductor device according to claim 11, wherein the volatile memory device, when power is recovered, is configured to parallelize recovery data received from the non-volatile memory device through the single dummy I/O pad, and store again the parallelized recovery data in the volatile memory through the plurality of global I/O lines.

16. The semiconductor device according to claim 15, further comprising:
a controller configured to generate the data retention path control signal in response to the power condition change signal; and
a plurality of data retention paths configured to sequentially couple the dummy I/O line to the plurality of global I/O lines in response to the data retention path control signal, and thus parallelize the recovery data.

17. The semiconductor device according to claim 16, further comprising:
a latch configured to temporarily store the recovery data received from the dummy I/O line.

18. The semiconductor device according to claim 17, wherein the plurality of data retention paths are respectively coupled to write drivers connected to the plurality of global I/O lines.

19. The semiconductor device according to claim 18, wherein the controller generates the data retention path control signal in a manner that the recovery data received from the latch is equally divided and supplied to the plurality of data retention paths.

20. A semiconductor device comprising:
a controller configured to generate a data retention path control signal in response to a power condition change signal;
a plurality of data retention paths configured to sequentially couple a plurality of global input/output (I/O) lines coupled to a volatile memory to a dummy I/O line in response to the data retention path control signal;
a dummy I/O pad coupled to the dummy I/O line; and
a non-volatile memory device coupled to the dummy I/O pad, configured to retain a plurality of storage data received from the volatile memory when a change in a power condition occurs with the volatile memory, or provide data retained in the volatile memory as recovery data when a change in a power condition occurs with the volatile memory.

* * * * *